(12) United States Patent
Miao et al.

(10) Patent No.: US 11,309,516 B2
(45) Date of Patent: Apr. 19, 2022

(54) DISPLAY PANEL PACKAGING METHOD AND PACKAGING STRUCTURE EACH HAVING LAMINATED STRUCTURE OF WATER-BLOCKING LAYER AND LIGHT-ABSORBING ADHESIVE LAYER

(71) Applicant: SHENZHEN CHINA STAR OPTOELECTRONICS SEMICONDUCTOR DISPLAY TECHNOLOGY CO., LTD., Shenzhen (CN)

(72) Inventors: Yang Miao, Shenzhen (CN); Jinchuan Li, Shenzhen (CN)

( * ) Notice: Subject to any disclaimer, the term of this patent is extended or adjusted under 35 U.S.C. 154(b) by 265 days.

(21) Appl. No.: 16/623,414

(22) PCT Filed: Nov. 8, 2019

(86) PCT No.: PCT/CN2019/116521
§ 371 (c)(1),
(2) Date: Dec. 17, 2019

(87) PCT Pub. No.: WO2021/082047
PCT Pub. Date: May 6, 2021

(65) Prior Publication Data
US 2021/0408446 A1 Dec. 30, 2021

(30) Foreign Application Priority Data
Oct. 28, 2019 (CN) .......................... 201911032877.8

(51) Int. Cl.
*H01L 51/52* (2006.01)
*H01L 51/56* (2006.01)

(52) U.S. Cl.
CPC ...... *H01L 51/5246* (2013.01); *H01L 51/5259* (2013.01); *H01L 51/5284* (2013.01); *H01L 51/56* (2013.01)

(58) Field of Classification Search
CPC ............. H01L 51/5246; H01L 51/5259; H01L 51/5284; H01L 51/56
See application file for complete search history.

(56) References Cited

U.S. PATENT DOCUMENTS

2012/0080671 A1* 4/2012 Niboshi ................ H01L 51/524
257/40
2013/0147346 A1* 6/2013 Su ....................... H01L 51/5246
313/512

(Continued)

FOREIGN PATENT DOCUMENTS

| CN | 107946480 A | 4/2018 |
| CN | 110098346 A | 8/2019 |

*Primary Examiner* — Michael Jung

(57) ABSTRACT

The present invention provides a display panel packaging method and a packaging structure. The display panel packaging method includes: providing a first substrate and forming a water-blocking layer, dispensing a sealant on a second substrate, coating a polymeric adhesive material in a region surrounded by the sealant, coating a light-absorbing material on the polymeric adhesive material, bonding the two substrates and uniformly mixing the polymeric adhesive material and the light-absorbing material to form a uniformly mixed film, and curing them and finishing packaging. This display panel packaging is effective.

17 Claims, 2 Drawing Sheets

(56) References Cited

U.S. PATENT DOCUMENTS

| | | | |
|---|---|---|---|
| 2014/0131691 A1* | 5/2014 | Yamamoto | H05B 33/04 |
| | | | 257/40 |
| 2016/0013444 A1* | 1/2016 | Cheng | H01L 51/5253 |
| | | | 257/40 |
| 2017/0207413 A1* | 7/2017 | Li | H01L 51/5259 |
| 2019/0036078 A1* | 1/2019 | Niiyama | H01L 51/5246 |
| 2019/0131567 A1 | 5/2019 | Li | |

* cited by examiner

DISPLAY PANEL PACKAGING METHOD AND PACKAGING STRUCTURE EACH HAVING LAMINATED STRUCTURE OF WATER-BLOCKING LAYER AND LIGHT-ABSORBING ADHESIVE LAYER

FIELD OF INVENTION

The present invention is related to the field of display technology, and specifically to a display panel packaging method and a packaging structure.

BACKGROUND OF INVENTION

Compared to liquid crystal display devices, organic light-emitting diode (OLED) display devices have advantages of self-luminosity, fast response times, and light weight, and have become an emerging technology in the display field.

After components of an OLED display panel are assembled, the OLED display panel needs to be effectively packaged to prevent external moisture from entering the OLED display panel. Currently, main processes for packaging the OLED display panel are: dispensing a sealant on a hard packaging cover plate, disposing a getter on an inner side of the sealant, assembling the packaging cover plate with the sealant and a thin-film transistor (TFT) substrate, curing the sealant, and finishing packaging. Because the sealant is generally made of simple organic materials, it cannot effectively block water, oxygen, and external light after curing, and a sealing effect is not ideal. The OLED display panel uses a current drive method, and it requires a driving switch having a faster response rate and a higher charge transfer rate. Because the driving switch is sensitive to ultraviolet light, external ultraviolet light easily causes an electrical property of substrates negative drift and affects the OLED display panel.

Therefore, solutions to those problems in the prior art are needed.

SUMMARY OF INVENTION

The packaging structure in the prior art has problems that a packaging design of a single sealant structure cannot effectively block external moisture, and that an effect of a negative drifted electrical property of internal substrates due to ultraviolet light cannot be reduced after finishing packaging.

The present invention provides a display panel packaging method and a packaging structure to solve problems of the prior packaging process that an unsatisfactory packaging effect, and that an effect of a negative drifted electrical property of internal substrates due to ultraviolet light cannot be reduced after finishing packaging and affects lifetime of display panel.

In order to solve the problems above, the present invention provides technical solutions as follows:

According to a first aspect of embodiments, the present invention provides a display panel packaging method including the steps of:

S100: providing a first substrate and forming a water-blocking layer on the first substrate;

S110: providing a second substrate and dispensing at least one turn of a first sealant on the second substrate;

S120: dispensing at least one turn of a second sealant on the second substrate along an inner region of the first sealant and coating a polymeric adhesive material on the second substrate in a region surrounded by the second sealant, wherein the polymeric adhesive material is coated by an inkjet printing process, and the polymeric adhesive material includes polyacrylate or polymethacrylates;

S130: coating a light-absorbing material on the polymeric adhesive material; and S140: bonding the first substrate and the second substrate, uniformly mixing the polymeric adhesive material and the light-absorbing material, curing the first sealant, the second sealant, and the polymeric adhesive material, and finishing packaging.

According to an embodiment of the present invention, in the step S130, the light-absorbing material includes polymer nanofibers, and the polymer nanofibers are selected from the group consisting of $TiO_2$, ZnO, and talcum.

According to an embodiment of the present invention, a material of the water-blocking layer includes SiNx, SiON, or SiOx.

According to an embodiment of the present invention, the light-absorbing material is disposed on the polymeric adhesive material by an electrospinning process or an electrostatic spraying process.

According to an embodiment of the present invention, a forming process of the water-blocking layer includes a chemical vapor deposition process or an atomic layer deposition process.

According to an embodiment of the present invention, in the step S100, an organic light-emitting diode (OLED) device layer is disposed on the first substrate, the water-blocking layer is formed on the OLED device layer, and the water-blocking layer covers the OLED device layer.

According to an embodiment of the present invention, in the step S140, the first substrate is bonded to the second substrate, and the water-blocking layer, the polymeric adhesive material, and the light-absorbing material are formed into a uniformly mixed film and cured by ultraviolet irradiation or heating.

According to a second aspect of the embodiments, the present invention provides a display panel packaging method including the steps of:

S100: providing a first substrate and forming a water-blocking layer on the first substrate;

S110: providing a second substrate and dispensing at least one turn of a first sealant on the second substrate;

S120: dispensing at least one turn of a second sealant on the second substrate along an inner region of the first sealant and coating a polymeric adhesive material on the second substrate in a region surrounded by the second sealant;

S130: coating a light-absorbing material on the polymeric adhesive material; and S140: bonding the first substrate and the second substrate, uniformly mixing the polymeric adhesive material and the light-absorbing material, curing the first sealant, the second sealant, and the polymeric adhesive material, and finishing packaging.

According to an embodiment of the present invention, in the step S120, the polymeric adhesive material is coated by an inkjet printing process.

According to an embodiment of the present invention, in the step S130, the light-absorbing material includes polymer nanofibers, and the polymer nanofibers are selected from the group consisting of $TiO_2$, ZnO, and talcum.

According to an embodiment of the present invention, the light-absorbing material is disposed on the polymeric adhesive material by an electrospinning process or an electrostatic spraying process.

According to an embodiment of the present invention, in the step S100, an organic light-emitting diode (OLED)

device layer is disposed on the first substrate, the water-blocking layer is formed on the OLED device layer, and the water-blocking layer covers the OLED device layer.

According to an embodiment of the present invention, in the step S140, the first substrate is bonded to the second substrate, and the water-blocking layer, the polymeric adhesive material, and the light-absorbing material are formed into a uniformly mixed film and cured by ultraviolet irradiation or heating.

According to an embodiment of the present invention, a forming process of the water-blocking layer includes a chemical vapor deposition process or an atomic layer deposition process.

According to an embodiment of the present invention, a material of the water-blocking layer includes $SiN_x$, SiON, or $SiO_x$.

According to a third aspect of the embodiments, the present invention further provides a packaging structure including:

a first substrate;

a second substrate disposed opposite to the first substrate, the second substrate including a display region and a packaging region, and the packaging region disposed around the display region;

a sealant disposed in the packaging region on the second substrate and disposed around the display region; and a polymer layer disposed in the display region on the second substrate, and the polymer layer including a light-absorbing material.

According to an embodiment of the present invention, the polymer layer is a laminated structure, and the laminated structure includes a water-blocking layer and a light-absorbing adhesive layer disposed sequentially.

According to an embodiment of the present invention, the polymer layer is a transparent layer, and the light-absorbing adhesive layer includes polymer nanofibers and an ultraviolet light absorber mixed uniformly.

According to an embodiment of the present invention, the sealant includes a first sealant and a second sealant disposed around the first sealant, and the second sealant includes a water-absorbing sealant.

In summary, the beneficial effects of the embodiments of the present invention are:

The present invention provides a display panel packaging method and a packaging structure, in which a water-blocking layer is disposed on a thin-film transistor substrate and a sealant and a polymer layer are disposed on another substrate. The polymer layer includes a light-absorbing adhesive having an ability for absorbing ultraviolet light. When the ultraviolet light passes through the polymer layer, it can be absorbed by the light-absorbing adhesive, and effectively blocks the ultraviolet light from irradiating a driving switch in a display panel, which can prevent an electrical property of substrates from drifting and improve a packaging effect and a display effect of the display panel.

DETAILED DESCRIPTION OF PREFERRED EMBODIMENTS

Embodiments are described below with reference to the appended drawings, and the drawings illustrate particular embodiments in which the present invention can be practiced.

Figure 1:
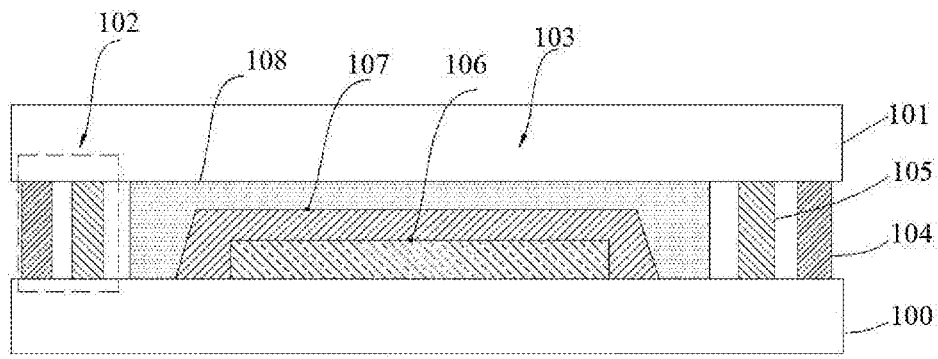
FIG. 1 is a diagram of a packaging structure of a display panel of an embodiment of the present invention.

After components of a display panel are assembled, the display panel needs to be effectively packaged to prevent external moisture from entering the OLED display panel. Also, a package layer can protect the components to ensure lifetime of the display panel. The present invention provides a packaging structure, as shown in FIG. 1, which is a diagram of the packaging structure of a display panel of an embodiment of the present invention. A display panel includes a first substrate 100 and a second substrate 101 disposed opposite to the first substrate 100. The first substrate 100 can be a thin-film transistor (TFT) array substrate. In this embodiment, the first substrate 100 is described by using the TFT array substrate as an example.

An organic light-emitting diode (OLED) device layer 106 and a water-blocking layer 107 are disposed on the first substrate 100. The water-blocking layer 107 is a transparent layer, which has a good light transmittance. The OLED device layer 106 is disposed in the display region 103. The water-blocking layer 107 is disposed on the OLED device layer 106 and fully covers the OLED device layer 106. The water-blocking layer 107 is formed on the OLED device layer 106 by a chemical vapor deposition (CVD) process or an atomic layer deposition (ALD) process, which effectively blocks external moisture.

The display panel further includes a packaging region 102, and the packaging region 102 is disposed around the display region 103. In the packaging region 102, at least one turn of a sealant is dispensed on the second substrate 101. In this embodiment, the sealant includes a first sealant 104 and a second sealant 105. The first sealant 104 is dispensed around an edge of the second substrate 101, and the second sealant 105 is dispensed around the first sealant 104 and disposed along an inner region of the first sealant 104. Specifically, the first sealant 104 is a sealant of an organic material commonly used in the prior art. The first substrate 100 and the second substrate 101 are mainly sealed by the first sealant 104, and also serve to bond and fix the two substrates. The second sealant 105 is a water-absorbing sealant mainly for further sealing the display panel and preventing external moisture from crossing the packaging region 102 and entering inside of the display panel, which achieves the best sealing effect.

The display panel further includes a polymer layer 108 covering the water-blocking layer 107.

When the display panel is in operation, the display panel is driven by a driving current. During a driving process, it requires a driving switch having a faster response rate and a higher charge transfer rate to ensure a better display effect of the display panel. The driving switch in the prior art is generally an indium gallium zinc oxide TFT (IGZO-TFT), which has a relatively poor stability and is particularly sensitive to external ultraviolet light. When the ultraviolet light irradiates the driving switch, it will cause an electrical property of the TFT negative drift and affect normal work and a normal display of the display panel.

In this embodiment, the polymer layer 108 can absorb the external ultraviolet light and block the external ultraviolet light from irradiating the driving switch. Specifically, the polymer layer 108 is a transparent layer, which has a good light transmittance. The polymer layer 108 is an adhesive layer made of a combination of a light-absorbing material, polymer nanofibers, $TiO_2$, ZnO, talcum, etc. The light-absorbing material is mainly an ultraviolet light absorber, and the polymer nanofibers mainly include transparent polymers such as polyacrylate, polymethacrylate, epoxy resin, etc. The polymer layer 108 is formed after the adhesive layer is cured. The polymer layer 108 can not only effectively absorb the external ultraviolet light, but also can protect the driving switch and seal the OLED device layer 106.

In this embodiment, the first sealant 104 and the second sealant 105 fix and seal the display panel. The polymer layer 108 in the display region 103 absorbs the external ultraviolet light, protecting the driving switch, preventing a problem of a negative drifted electrical property of internal substrates, and improving the display effect.

Figure 2:
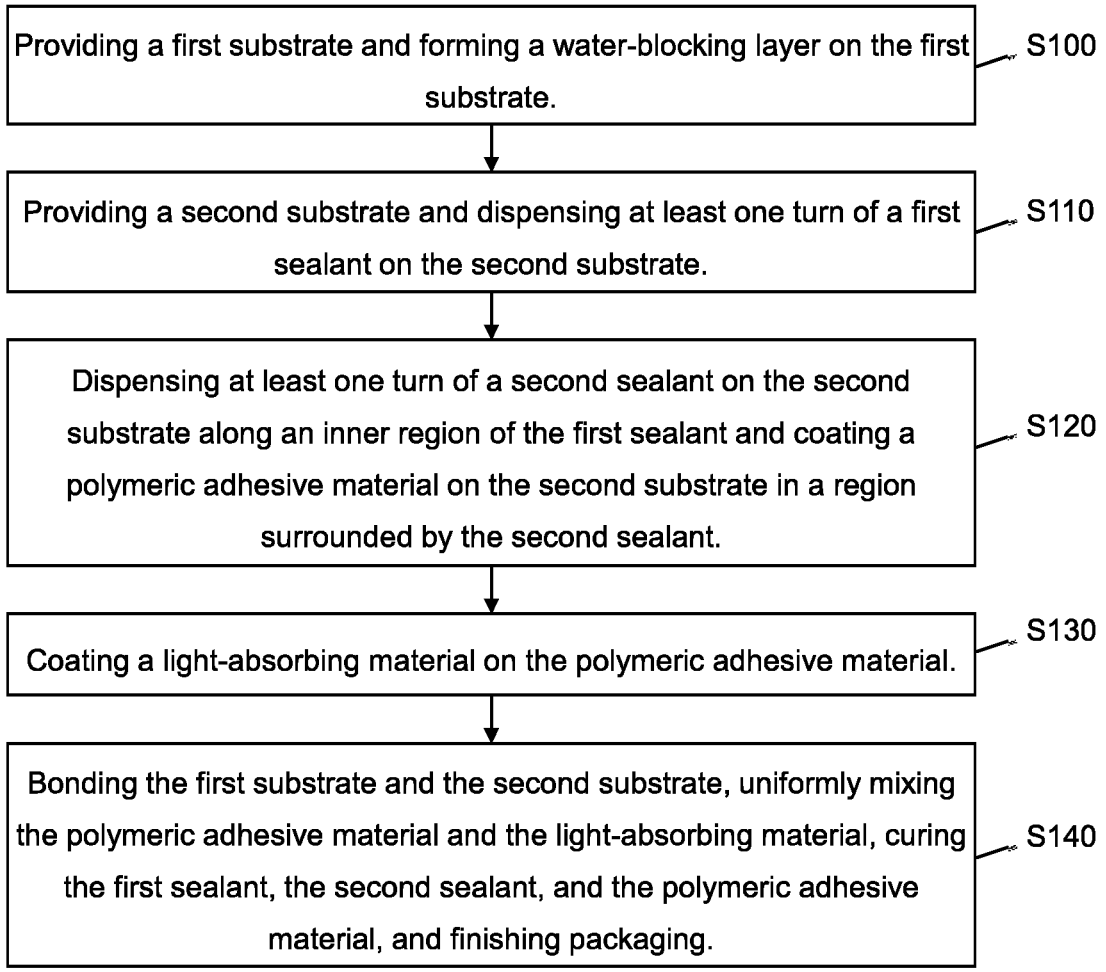
FIG. 2 is a flowchart of a display panel packaging method of an embodiment of the present invention.

Furthermore, the present invention provides a display panel packaging method, as shown in FIG. 2, which is a flowchart of the display panel packaging method of an embodiment of the present invention. The display panel packaging method including the steps of:

S100: providing a first substrate and forming a water-blocking layer on the first substrate.

In this embodiment, the first substrate is a thin-film transistor (TFT) array substrate. An organic light-emitting diode (OLED) device layer is disposed on the first substrate after the TFT array substrate and the other film layer are disposed. Furthermore, a water-blocking layer is formed on the OLED device layer and covers the OLED device layer, protecting and sealing the OLED device layer.

A material of the water-blocking layer includes a laminated structure made of one or more of $SiN_x$, SiON, or $SiO_x$.

Figure 3:
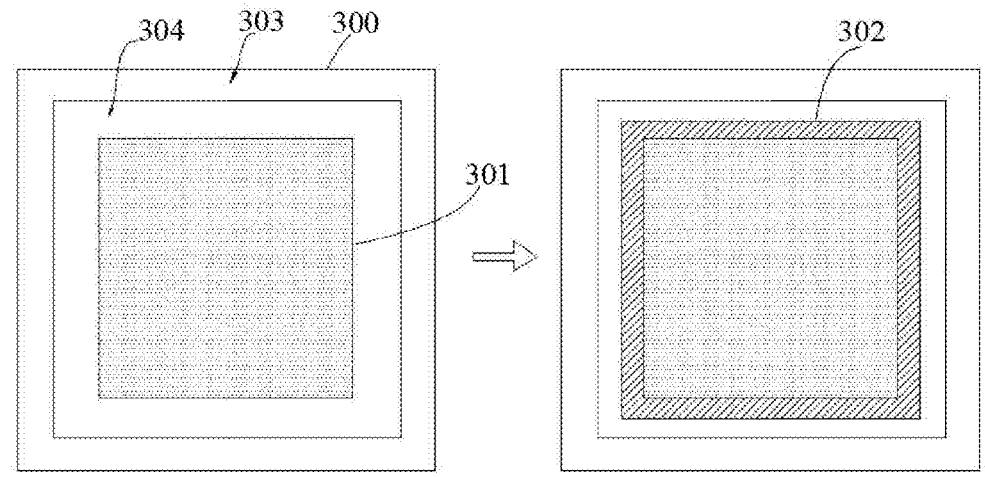
FIG. 3 is a process flow diagram of forming a first substrate of an embodiment of the present invention.

Specifically, as shown in FIG. 3, which is a process flow diagram of forming a first substrate of an embodiment of the present invention, the first substrate 300 includes a display region 304 and a packaging region 303. The water-blocking layer 302 is formed on the OLED device layer 301 after the OLED device layer 301 is disposed on the first substrate 300.

S110: providing a second substrate and dispensing at least one turn of a first sealant on the second substrate. The second substrate can be a cover plate, and the first sealant is dispensed around an edge of the second substrate. In order to ensure a packaging effect, multi-turn of the first sealant can be dispensed.

S120: dispensing at least one turn of a second sealant on the second substrate along an inner region of the first sealant and coating a polymeric adhesive material in a region surrounded by the second sealant.

S130: coating a light-absorbing material on the polymeric adhesive material.

The first substrate and the second substrate are connected and sealed by the first sealant. In order to further improve a sealing effect, the second sealant is dispensed along the inner region of the first sealant, and the second sealant is mainly a water-absorbing sealant, which can effectively absorb external moisture entering from outside.

After the first sealant and the second sealant are dispensed, a polymeric adhesive material is coated in a display region of the second substrate corresponding to the OLED device layer. The polymeric adhesive material can be coated by an inkjet printing process. The polymeric adhesive material is uniformly coated in the display region of the second substrate, and after the polymeric adhesive material is coated, polymer nanofibers are coated on it by an electro-spinning process or an electrostatic spraying process. A material of the polymer nanofibers can be same as a material of the polymeric adhesive material. The material of the polymer nanofibers is mixed with an ultraviolet light absorber. The ultraviolet light absorber can be nano-sized particles of materials of $TiO_2$, ZnO, talcum, etc., which can effectively absorb ultraviolet light, and prevent the ultraviolet light from entering internal of the display panel.

Figure 4:
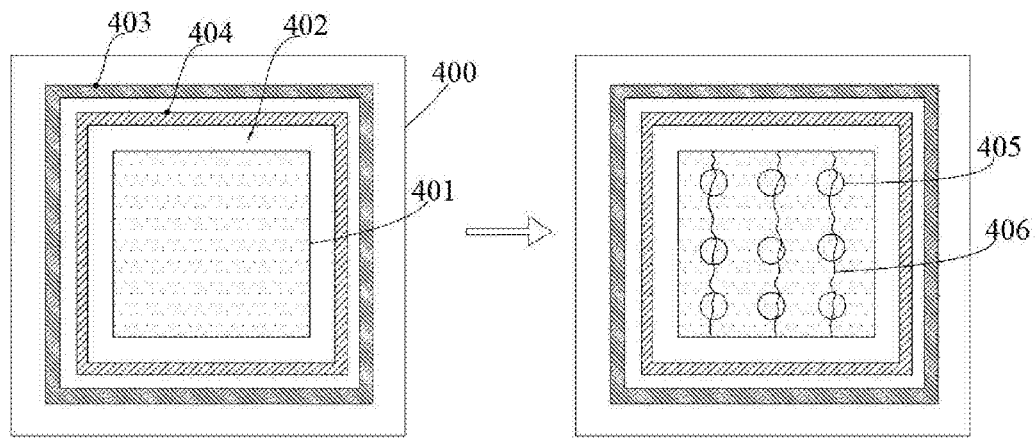
FIG. 4 is a process flow diagram of forming a second substrate of an embodiment of the present invention.

Specifically, as shown in FIG. 4, which is a process flow diagram of forming a second substrate of an embodiment of the present invention, according to the steps S102 and S103, the first sealant 403 and the second sealant 404 are dispensed on the second substrate 400, and the polymeric adhesive material 401 is coated in a corresponding region of the display region 402.

Furthermore, the light-absorbing material 405 is uniformly coated on the polymeric adhesive material 401. In order to ensure an integrity of an adhesive layer, polymer nanofibers 406 are further coated between the polymer adhesive material 401 and the light-absorbing material 405.

S140: bonding the first substrate and the second substrate, uniformly mixing the polymeric adhesive material and the light-absorbing material, curing the first sealant, the second sealant, and the polymeric adhesive material, and finishing packaging.

With reference to the process flow diagrams in FIGS. 3 and 4, after the first substrate 300 and the second substrate 400 are both prepared, the two substrates are pressed together under vacuum. During the pressing process, the water-blocking layer 302 in the first substrate 300, the polymeric adhesive material 401 in the second substrate 400, and the light-absorbing material 405 and the polymer nanofibers 406 disposed on the polymeric adhesive material 401 are contacted. These material films are mixed under a pressure, and they are formed into a uniformly mixed film. Finally, the uniformly mixed film and the sealants are cured by ultraviolet irradiation or heating to complete a packaging of the display panel.

The display panel packaging method and the packaging structure provided by embodiments of the present invention are described in detail above, and the description of embodiments above is only for helping to understand technical solutions of the present invention and its core idea. Understandably, for a person of ordinary skill in the art can make various modifications of the technical solutions of the embodiments of the present invention above. However, it does not depart from the scope of the technical solutions of the embodiments of the present invention.

What is claimed is:

1. A packaging structure, comprising:
a first substrate;
a second substrate disposed opposite to the first substrate, the second substrate comprising a display region and a packaging region, and the packaging region disposed around the display region;
a sealant disposed in the packaging region on the second substrate and disposed around the display region; and
a polymer layer disposed in the display region on the second substrate, wherein the polymer layer is a transparent layer and is a laminated structure comprising a water-blocking layer and a light-absorbing adhesive layer disposed sequentially, and the light-absorbing adhesive layer comprises polymer nanofibers and an ultraviolet light absorber mixed uniformly.

2. The packaging structure according to claim 1, wherein the sealant comprises a first sealant and a second sealant disposed around the first sealant, and the second sealant comprises a water-absorbing sealant.

3. A display panel packaging method, comprising steps of:
S100: providing a first substrate and forming a water-blocking layer on the first substrate;
S110: providing a second substrate and dispensing at least one turn of a first sealant on the second substrate;
S120: dispensing at least one turn of a second sealant on the second substrate along an inner region of the first sealant and coating a polymeric adhesive material on the second substrate in a region surrounded by the second sealant, wherein the polymeric adhesive material is coated by an inkjet printing process, and the polymeric adhesive material comprises polyacrylate or polymethacrylate;
S130: coating a light-absorbing material on the polymeric adhesive material; and
S140: bonding the first substrate and the second substrate, uniformly mixing the polymeric adhesive material and the light-absorbing material, curing the first sealant, the second sealant, and the polymeric adhesive material, and finishing packaging.

4. The display panel packaging method according to claim 3, wherein in the step S130, the light-absorbing material comprises polymer nanofibers, and the polymer nanofibers are selected from the group consisting of $TiO_2$, ZnO, and talcum.

5. The display panel packaging method according to claim 4, wherein the light-absorbing material is disposed on the polymeric adhesive material by an electrospinning process or an electrostatic spraying process.

6. The display panel packaging method according to claim 3, wherein a material of the water-blocking layer comprises $SiN_x$, SiON, or $SiO_x$.

7. The display panel packaging method according to claim 3, wherein a forming process of the water-blocking layer comprises a chemical vapor deposition process or an atomic layer deposition process.

8. The display panel packaging method according to claim 3, wherein in the step S100, an organic light-emitting diode (OLED) device layer is disposed on the first substrate, the water-blocking layer is formed on the OLED device layer, and the water-blocking layer covers the OLED device layer.

9. The display panel packaging method according to claim 3, wherein in the step S140, the first substrate is bonded to the second substrate, and the water-blocking layer, the polymeric adhesive material, and the light-absorbing material are formed into a uniformly mixed film and cured by ultraviolet irradiation or heating.

10. A display panel packaging method, comprising steps of:
S100: providing a first substrate and forming a water-blocking layer on the first substrate;
S110: providing a second substrate and dispensing at least one turn of a first sealant on the second substrate;
S120: dispensing at least one turn of a second sealant on the second substrate along an inner region of the first sealant and coating a polymeric adhesive material on the second substrate in a region surrounded by the second sealant;
S130: coating a light-absorbing material on the polymeric adhesive material; and
S140: bonding the first substrate and the second substrate, uniformly mixing the polymeric adhesive material and the light-absorbing material, curing the first sealant, the second sealant, and the polymeric adhesive material, and finishing packaging.

11. The display panel packaging method according to claim 10, wherein in the step S120, the polymeric adhesive material is coated by an inkjet printing process.

12. The display panel packaging method according to claim 10, wherein in the step S130, the light-absorbing material comprises polymer nanofibers, and the polymer nanofibers are selected from the group consisting of $TiO_2$, ZnO, and talcum.

13. The display panel packaging method according to claim 12, wherein the light-absorbing material is disposed on the polymeric adhesive material by an electrospinning process or an electrostatic spraying process.

14. The display panel packaging method according to claim 10, wherein in the step S100, an organic light-emitting diode (OLED) device layer is disposed on the first substrate, the water-blocking layer is formed on the OLED device layer, and the water-blocking layer covers the OLED device layer.

15. The display panel packaging method according to claim 10, wherein in the step S140, the first substrate is bonded to the second substrate, and the water-blocking layer, the polymeric adhesive material, and the light-absorbing material are formed into a uniformly mixed film and cured by ultraviolet irradiation or heating.

16. The display panel packaging method according to claim 10, wherein a forming process of the water-blocking layer comprises a chemical vapor deposition process or an atomic layer deposition process.

17. The display panel packaging method according to claim 10, wherein a material of the water-blocking layer comprises $SiN_x$, SiON, or $SiO_x$.

* * * * *